United States Patent
Zhang et al.

(10) Patent No.: US 10,979,278 B2
(45) Date of Patent: Apr. 13, 2021

(54) METHOD, DEVICE FOR COMPENSATING IMBALANCE BETWEEN I PATH AND Q PATH OF RECEIVER, AND NON-TRANSITORY COMPUTER READABLE STORAGE MEDIUM

(71) Applicant: Radiawave Technologies Co., Ltd., Guangdong (CN)

(72) Inventors: Liuan Zhang, Guangdong (CN); Yulin Tan, Guangdong (CN); Ning Zhang, Guangdong (CN); Jon Sweat Duster, Beaverton, OR (US); Haigang Feng, Guangdong (CN)

(73) Assignee: Radiawave Technologies Co., Ltd., Guangdong (CN)

(*) Notice: Subject to any disclaimer, the term of this patent is extended or adjusted under 35 U.S.C. 154(b) by 0 days.

(21) Appl. No.: 16/957,385

(22) PCT Filed: Dec. 29, 2018

(86) PCT No.: PCT/CN2018/125236
§ 371 (c)(1),
(2) Date: Jun. 24, 2020

(87) PCT Pub. No.: WO2019/137253
PCT Pub. Date: Jul. 18, 2019

(65) Prior Publication Data
US 2020/0322209 A1 Oct. 8, 2020

(30) Foreign Application Priority Data
Jan. 12, 2018 (CN) .......................... 201810034094.2

(51) Int. Cl.
*H04L 27/38* (2006.01)
*H03F 1/32* (2006.01)
(Continued)

(52) U.S. Cl.
CPC ....... *H04L 27/3863* (2013.01); *H03F 1/3288* (2013.01); *H04L 27/2278* (2013.01); *H04L 27/364* (2013.01); *H03F 2200/336* (2013.01)

(58) Field of Classification Search
CPC ... H04L 27/2278; H04L 27/364; H04L 27/38; H04L 27/3863; H04L 1/24; H04L 1/243;
(Continued)

(56) References Cited

U.S. PATENT DOCUMENTS 8,427,366 B2 * 4/2013 Ganeshan ............... G01S 19/37
342/357.46
2009/0122918 A1 5/2009 Li et al.
(Continued)

FOREIGN PATENT DOCUMENTS

CN 101518014 A 8/2009
CN 101815056 A 8/2010
(Continued)

*Primary Examiner* — Siu M Lee

(57) ABSTRACT

The present disclosure provides a method for compensating an imbalance between an I path and a Q path of a receiver. The method includes: sending a cosine signal and a sine signal through a signal generator, transmitting the cosine signal and the sine signal in the I path and Q path respectively; calculating autocorrelation values of the I path and the Q path in the signal receiving direction; determining a comparison result of amplitudes of the cosine signal received by the I path and the sine signal received by the Q path according to the autocorrelation values; calculating an adjustment compensation value of an analog domain gain amplifier, and an amplitude value and a phase value in a digital domain according to the comparison result of amplitudes; and compensating and adjusting the signal according to the adjustment compensation value, the amplitude value and the phase value.

17 Claims, 3 Drawing Sheets

(51) Int. Cl.
*H04L 27/227* (2006.01)
*H04L 27/36* (2006.01)

(58) Field of Classification Search
CPC ....... H04L 1/244; H04L 1/248; H03F 1/3288; H03F 2200/336
See application file for complete search history.

(56) References Cited

U.S. PATENT DOCUMENTS

2010/0067622 A1* 3/2010 Komaili ................ H03D 3/009
375/345
2016/0182106 A1 6/2016 Anderson

FOREIGN PATENT DOCUMENTS

| | | |
|---|---|---|
| CN | 102882818 A | 1/2013 |
| CN | 103581078 A | 2/2014 |
| CN | 104486272 A | 4/2015 |
| CN | 106878229 A | 6/2017 |
| CN | 107547458 A | 1/2018 |
| CN | 108040029 A | 5/2018 |
| EP | 2053812 A2 | 4/2009 |
| JP | 2013118530 A | 6/2013 |

* cited by examiner

METHOD, DEVICE FOR COMPENSATING IMBALANCE BETWEEN I PATH AND Q PATH OF RECEIVER, AND NON-TRANSITORY COMPUTER READABLE STORAGE MEDIUM

CROSS REFERENCE TO RELATED APPLICATIONS

The present disclosure claims the priority of Chinese Patent Application No. 201810034094.2, entitled "METHOD, DEVICE AND EQUIPMENT FOR COMPENSATING IMBALANCE BETWEEN I PATH AND Q PATH OF RECEIVER", filed on Jan. 12, 2018, submitted to the China Patent Office, which is hereby incorporated by reference in its entirety.

TECHNICAL FIELD

The present disclosure relates to the technical field of communication, and in particular, to a method, a device, and an equipment for compensating an imbalance between an I path and a Q path of a receiver.

BACKGROUND

With the rapid development of wireless technology, products using wireless communication system are becoming more and more popular. The radio frequency (RF) receiver widely used in the wireless communication system usually has two signal paths in the receiving channel, which are the in-phase (I) path and the quadrature (Q) path respectively. Since the phases of I path and Q path cannot be completely orthogonal, and the gains of I path and Q path cannot be completely the same, it will cause the imbalance between I path and Q path, which in turn will worsen the error vector magnitude (EVM). However, at present, there is no suitable solution to the problem of compensation for the imbalance between I path and Q path of the receiver, which leads to the generally low accuracy of the compensation for the imbalance between I path and Q path of the existing receiver.

SUMMARY

Based on the above, the present disclosure provides a method, a device, and an equipment for compensating an imbalance between an I path and a Q path of a receiver, aiming at solving the current problem of unbalanced compensation between the I and Q paths of the receiver. There is no suitable solution, which leads to the generally low accuracy of the compensation for the imbalance between the I and Q paths of the existing receiver.

According to an aspect of the present disclosure, the present disclosure provides a method for compensating an imbalance between an I path and a Q path of a receiver, including:

sending a cosine signal and a sine signal through a signal generator with configurable waveform amplitude and phase when receiving a signal to be compensated, transmitting the cosine signal and the sine signal in the I path and Q path respectively, each path corresponding to a signal, the cosine signal and the sine signal being configured to loop back to a signal receiving direction after passing through an up conversion;

calculating autocorrelation values of the I path and the Q path in the signal receiving direction;

determining a comparison result of amplitudes of the cosine signal received by the I path and the sine signal received by the Q path according to the autocorrelation values;

calculating an adjustment compensation value of an analog domain gain amplifier, and an amplitude value and a phase value to be compensated in a digital domain according to the comparison result of amplitudes; and compensating and adjusting the signal to be compensated according to the adjustment compensation value, the amplitude value and the phase value.

According to another aspect of the present disclosure, the present disclosure provides a device for compensating an imbalance between an I path and a Q path of a receiver, including:

a configuration unit, configured for sending a cosine signal and a sine signal through a signal generator with configurable waveform amplitude and phase when receiving a signal to be compensated, transmitting the cosine signal and the sine signal in the I path and the Q path respectively, each path corresponding to a signal, the cosine signal and the sine signal being configured to loop back to a signal receiving direction after passing through an up conversion;

a calculation unit, configured for calculating autocorrelation values of the I path and the Q path in the signal receiving direction;

a determination unit, configured for determining a comparison result of amplitudes of the cosine signal received by the I path and the sine signal received by the Q path according to the autocorrelation values;

the calculation unit, further configured for calculating an adjustment compensation value of an analog domain gain amplifier, and an amplitude value and a phase value to be compensated in a digital domain according to the comparison result of amplitudes; and a compensation unit, configured for compensating and adjusting the signal to be compensated according to the adjustment compensation value, the amplitude value and the phase value.

According to another aspect of the present disclosure, the present disclosure provides a storage medium storing a computer program, the program, when executed by a processor, implements the operations of the method for compensating the imbalance between the I path and the Q path of the receiver described above.

According to yet another aspect of the present disclosure, the present disclosure provides an equipment for compensating an imbalance between an I path and a Q path of a receiver, including a storage medium, a processor and a computer program stored on the storage medium and executable on the processor, the program, when executed by the processor, implements the operations of the method for compensating the imbalance between the I path and the Q path of the receiver described above.

According to the above solutions, the present disclosure provides a method, a device and an equipment for compensating an imbalance between an I path and a Q path of a receiver. Compared with the related arts, the present disclosure is configured to send a cosine signal and a sine signal through a signal generator with configurable waveform amplitude and phase when receiving a signal to be compensated, transmit the cosine signal and the sine signal in the I path and the Q path respectively, each path corresponding to a signal, the cosine signal and the sine signal being configured to loop back to a signal receiving direction after passing through an up conversion; calculate autocorrelation values of the I path and the Q path in the signal receiving direction;

determine a comparison result of amplitudes of the cosine signal received by the I path and the sine signal received by the Q path according to the autocorrelation values; calculate an adjustment compensation value of the analog domain gain amplifier, and an amplitude value and a phase value to be compensated in a digital domain, thereby compensate and adjust the signal to be compensated according to the calculated values, which may accurately and effectively compensate the imbalance between the I path and the Q path of the receiver, and may distribute the larger amplitude deviation to the analog domain amplifier, while performing IQ imbalance calibration, and also indirectly improve the dynamic range of the analog-to-digital converter (ADC).

The above description is only an overview of the technical solutions of the present disclosure. In order to understand the technical means of the present disclosure more clearly, it can be implemented in accordance with the content of the specification, and in order to make the above and other purposes, features, and advantages of the present disclosure more obvious and understandable, the following is a specific implementation of the present disclosure.

BRIEF DESCRIPTION OF THE DRAWINGS

The drawings described herein are used to help understand the present disclosure and form part of the present disclosure. The schematic embodiments of the present disclosure and descriptions thereof are used to explain the present disclosure and do not constitute an undue limitation on the present disclosure. In the drawings.

DETAILED DESCRIPTION OF THE EMBODIMENTS

Hereinafter, the present disclosure will be described in detail with reference to the drawings and in conjunction with the embodiments. It should be noted that the embodiments in the present disclosure and the features in the embodiments can be combined with each other if there is no conflict.

Figure 1:
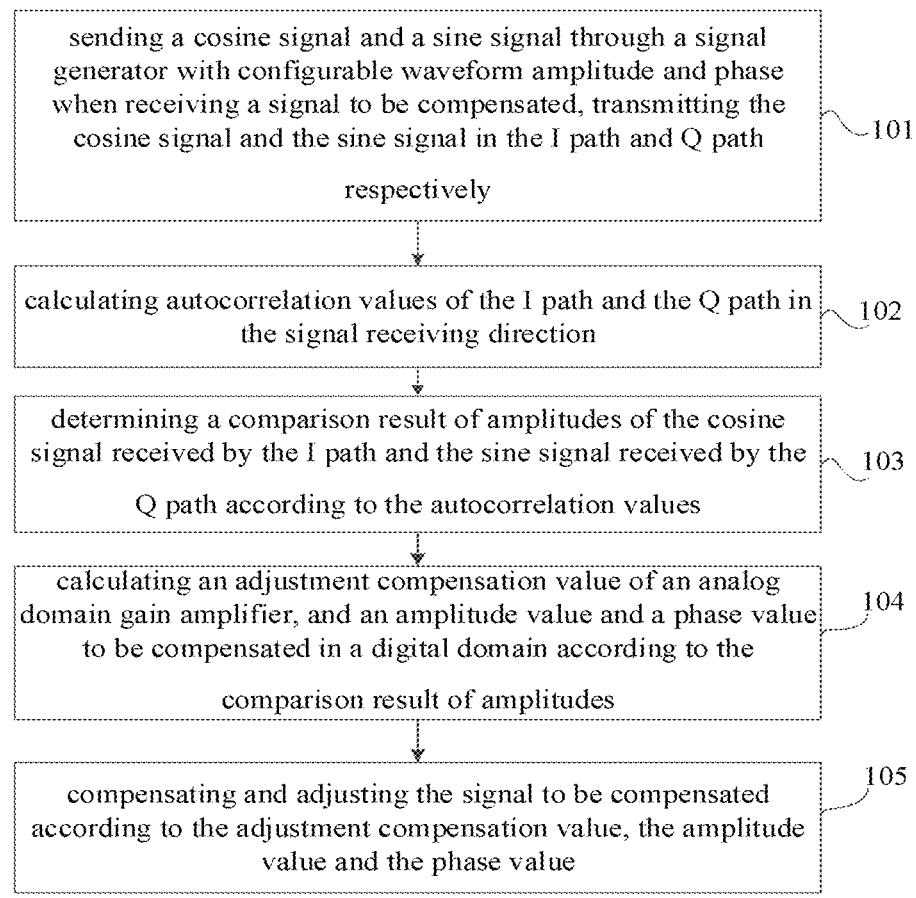
FIG. 1 shows a schematic flowchart of a method for compensating an imbalance between an I path and a Q path of a receiver according to an embodiment of the present disclosure.

In the present embodiment, a method for compensating an imbalance between an I path and a Q path of a receiver is provided, thereby it is possible to accurately and effectively compensate and adjust the imbalance between the I path and Q path of the receiver. As shown in FIG. 1, the method includes:

Operation 101, sending a cosine signal and a sine signal through a signal generator with configurable waveform amplitude and phase when receiving a signal to be compensated, transmitting the cosine signal and the sine signal in the I path and the Q path respectively, each path corresponding to a signal, the cosine signal and the sine signal being configured to loop back to a signal receiving direction after passing through an up conversion. In the present embodiment, which path transmits the cosine signal and which path transmits the sine signal can be selected and set according to actual needs.

In order to adapt to different application scenarios, there are many optional ways to loop back to the signal receiving direction. As an optional method, for this embodiment, it may also loop back to the signal receiving direction after passing the amplifier behind the up conversion.

The execution subject of this embodiment may be a device for automatically compensating and adjusting the imbalance between the I and Q paths of the receiver. Under the assumption that the DC offset of the receiver is corrected in advance, in the direction of signal transmission (TX), the device sends out cosine and sine signals through a signal generator with configurable waveform amplitude and phase, and is configured to transmit the cosine signal in the I path and transmit the sine signal in the Q path, then the cosine signal and the sine signal are configured to loop back to a signal receiving direction after passing through an up conversion. Using the formula, follow the operations to calculate the precise amplitude and phase values that need to be compensated, so as to adjust the compensation based on these calculated values.

In order to send out the cosine signal and the sine signal through the signal generator, an alternative way is to generate the sine and cosine wave based on the cordic principle, another alternative way is to store the data points of the sine and cosine waves in the random access memory (RAM), so that the waveform generator can be used to send out the sine and cosine wave waveforms from the RAM, and then send out the cosine and sine signals. Besides, in this embodiment, amplitude and phase may be configurable, the sine signal is configurable on the I or Q path, and the cosine signal is configurable on the I or Q path.

In order to improve the phase accuracy of the cosine signal and the sine signal, at least 16 bits are required to represent 360 degrees to achieve higher calibration accuracy when fixed-point, and it does not rule out the occasion where the bit width is reduced to exclude accuracy in some occasions.

Operation 102, calculating autocorrelation values of the I path and the Q path in the signal receiving direction.

In this embodiment, the process of calculating the autocorrelation values of the I path and the Q path can refer to the existing calculation method, which will not be repeated here.

As an optional method, operation 102 may specifically include calculating an autocorrelation value $<I''(t)I''(t)>$ of the I path, an autocorrelation value $<Q''(t)Q''(t)>$ of the Q path, and an autocorrelation value $<I''(t)Q''(t)>$ between the I path and Q path during an integer multiple period in the signal receiving direction. After obtaining these autocorrelation values, we can refer to the subsequent operations for calculation.

Operation 103, determining a comparison result of amplitudes of the cosine signal received by the I path and the sine signal received by the Q path according to the autocorrelation values.

For example, the amplitude of the cosine signal is A, and the amplitude of the sine signal is B. By comparison, determine which is larger and smaller between A and B.

To illustrate the specific implementation process of operation 103, in an optional method, the I path receives a cosine signal and the Q path receives a sine signal. Accordingly, operation 103 may specifically include determining the amplitude $\beta_i$ of the cosine signal received by the I path being greater than the amplitude $\beta_q$ of the sine signal received by the Q path, or $\beta_i$ being less than $\beta_q$ according to the following two formulas:

$$\langle I'(t)I'(t)\rangle = \beta_i^2 \langle \cos^2(\omega t+\varphi_i)\rangle = \beta_i^2 \langle \tfrac{1}{2}+\tfrac{1}{2}\cos 2\omega t\rangle = \tfrac{1}{2}\beta_i^2 \text{ and}$$

$$\langle Q'(t)Q'(t)\rangle = \beta_q^2 \langle \cos^2(\omega t+\varphi_q)\rangle = \beta_q^2 \langle \tfrac{1}{2}+\tfrac{1}{2}\cos 2\omega t\rangle = \tfrac{1}{2}\beta_q^2,$$

$\varphi_i$ represents a phase of the cosine signal received by the I path and $\varphi_q$ represents a phase of the sine signal received by the Q path.

Operation 104, calculating an adjustment compensation value of an analog domain gain amplifier, and an amplitude value and a phase value to be compensated in a digital domain according to the comparison result of amplitudes.

In this embodiment, a preset formula may be used to calculate the adjustment compensation value of the analog domain gain amplifier, as well as the amplitude and phase values that need to be compensated in the digital domain. The specific form of the preset formula can be preset according to actual needs.

In order to explain the specific implementation of calculating the adjustment compensation value of the analog domain gain amplifier, in an optional manner, based on the formula interpretation in operation 103, the operation of "calculating an adjustment compensation value of an analog domain gain amplifier according to the comparison result of amplitudes" may specially include calculating a value of $\beta_i/\beta_q$ if $\beta_i$ is less than $\beta_q$; calculating a value of $\beta_q/\beta_i$ if $\beta_i$ is greater than $\beta_q$; and calculating a compensation value of the analog domain gain amplifier to be adjusted in the I path or Q path according to the calculated value of $\beta_i/\beta_q$ or $\beta_q/\beta_i$, and the minimum adjustment compensation of the analog domain amplifier to minimize the value between $\beta_i$ and $\beta_q$, such that $\beta_i$ and $\beta_q$ are as close as possible, the remaining residue is put into the digital domain to compensate, thereby it is possible to allocate a larger amplitude deviation to the analog domain amplifier, thus while the IQ imbalance calibration is performed, and the dynamic range of the ADC is also indirectly improved.

In order to explain the specific implementation of calculating the amplitude and phase values that need to be compensated in the digital domain, in an optional manner, based on the formulas in the above operations, the operation of "calculating an amplitude value and a phase value to be compensated in a digital domain according to the comparison result of amplitudes" may specially include calculating $\sec(\varphi_q-\varphi_i)$ according to the preset formula:

$$\sec(\varphi_q-\varphi_i) = \frac{\beta_i\beta_q}{\sqrt{(\beta_i\beta_q)^2 - 4*\langle I''(t)q''(t)\rangle^2}} = \frac{\sqrt{\langle I''(t)I''(t)\rangle\langle Q''(t)Q''(t)\rangle}}{\sqrt{\langle I''(t)I''(t)\rangle\langle Q''(t)Q''(t)\rangle - \langle I''(t)Q''(t)\rangle^2}};$$

and calculating $\tan(\varphi_q-\varphi_i)$ according to the preset formula:

$$\tan(\varphi_q-\varphi_i) = \frac{\beta_i\beta_q}{\sqrt{(\beta_i\beta_q)^2 - 4*\langle I''(t)q''(t)\rangle^2}} =$$

-continued $$\frac{\langle I''(t)Q''(t)\rangle}{\sqrt{\langle I''(t)I''(t)\rangle\langle Q''(t)Q''(t)\rangle - \langle I''(t)Q''(t)\rangle^2}};$$

then based on the above result, if $\beta_i$ is greater than $\beta_q$, compensating the received I(t) and Q(t) for amplitude and phase of according to the preset formula:

$$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} \beta_q/\beta_i & 0 \\ \frac{\beta_q}{\beta_i} * \tan(\varphi_q - \varphi_i) & \sec(\varphi_q - \varphi_i) \end{bmatrix} \begin{bmatrix} I''(t) \\ Q''(t) \end{bmatrix};$$

if $\beta_i$ is less than $\beta_q$, compensating the received I(t) and Q(t) for amplitude and phase according to the preset formula:

$$\begin{bmatrix} \cos\varphi_i & -\sin\varphi_i \\ \sin(\varphi_i) & \cos(\varphi_i) \end{bmatrix} \begin{bmatrix} \beta_i I(t) \\ \beta_i Q(t) \end{bmatrix} = \begin{bmatrix} 1 & 0 \\ \tan(\varphi_q - \varphi_i) & \frac{\beta_i}{\beta_q} * \sec(\varphi_q - \varphi_i) \end{bmatrix} \begin{bmatrix} I''(t) \\ Q''(t) \end{bmatrix}.$$

Operation 105, compensating and adjusting the signal to be compensated according to the adjustment compensation value, the amplitude value and the phase value.

For example, according to the calculated adjustment compensation value, amplitude value and phase value, the amplitude and phase of the signal to be compensated are compensated and adjusted to offset the influence of the imbalance between the I path and the Q path.

To illustrate the specific implementation process of operation 105, as an optional method, operation 105 may specifically include compensating and adjusting the analog domain gain amplifier according to the adjustment compensation value, and after compensating and adjusting the analog domain gain amplifier, compensating and adjusting the digital domain according to the amplitude value and the phase value. In this way, the analog domain gain amplifier is first compensated and adjusted, and then the remaining residual part is placed in the digital domain for compensation, such that the larger amplitude deviation is allocated to the analog domain amplifier, thus while the IQ imbalance calibration is performed, and the dynamic range of the ADC is also indirectly improved.

It should be noted that the above formulas are not the only formulas to implement the present disclosure, but are only used as an implementation manner of the embodiments. Technicians can make appropriate modifications to the formula according to business needs, and still fall within the scope of the present disclosure, such as adding parameters or multiple values.

By applying the above solution, compared with the current existing technology, the embodiments of the present disclosure can accurately calculate the adjustment compensation value of the analog domain gain amplifier, and the amplitude value and the phase value that need to be compensated in the digital domain. Furthermore, the compensation signal is compensated and adjusted according to these calculated values, and the unbalance between the I path and the Q path of the receiver can be compensated accurately and effectively.

As a refinement and expansion of the specific implementation of the above embodiment, in order to explain the rationality of the above formula, the following formula is specifically derived for the above preset formula.

The amplitude of the cosine wave received by the I path is $\beta_i$, and the phase of the cosine wave received by the I path is $\varphi_i$. The amplitude of the cosine wave received by the Q path is $\beta_q$, and the phase of the cosine wave received by the Q path is $\varphi_q$. Then the expressions of the baseband signals received by the I and Q paths are:

$$I''=\beta_i*\cos(\omega t+\varphi_i)$$

$$Q''=\beta_q*\sin(\omega t+\varphi_q)$$

Perform matrix transformation on the above formulas, there are:

$$\begin{bmatrix} I''(t) \\ Q''(t) \end{bmatrix} = \begin{bmatrix} \beta_i\cos\varphi_i & -\beta_i\sin\varphi_i \\ \beta_q\sin\varphi_q & \beta_q\cos\varphi_q \end{bmatrix}\begin{bmatrix} \cos\omega t \\ \sin\omega t \end{bmatrix}$$

$$\begin{bmatrix} \cos\omega t \\ \sin\omega t \end{bmatrix} = \begin{bmatrix} \beta_i\cos\varphi_i & -\beta_i\sin\varphi_i \\ \beta_q\sin\varphi_q & \beta_q\cos\varphi_q \end{bmatrix}^{-1}\begin{bmatrix} I''(t) \\ Q''(t) \end{bmatrix}$$

cos ωt may be considered to be the original I, sin ωt may be considered to be the original Q, then:

$$\begin{bmatrix} I \\ Q \end{bmatrix} = \begin{bmatrix} \beta_i\cos\varphi_i & -\beta_i\sin\varphi_i \\ \beta_q\sin\varphi_q & \beta_q\cos\varphi_q \end{bmatrix}^{-1}\begin{bmatrix} I''(t) \\ Q''(t) \end{bmatrix}$$

During the period of an integer multiple of N, the average value of a periodic signal x(t) can be expressed as:

$$x(t) \geq \frac{1}{NT}\int_{t-NT}^{t} x(u)du \qquad \text{(formula 1)}$$

T is the period, equal to 2pi/ω, and N is any integer greater than 0.

From the above formulas, there are:

$$\langle I''(t)I''(t)\rangle = \beta_i^2\langle\cos^2(\omega t+\varphi_i)\rangle = \beta_i^2\left(\frac{1}{2}+\frac{1}{2}\cos2\omega t\right) = \frac{1}{2}\beta_i^2$$

$$\langle Q''(t)Q''(t)\rangle = \beta_q^2\langle\cos^2(\omega t+\varphi_q)\rangle = \beta_q^2\left(\frac{1}{2}+\frac{1}{2}\cos2\omega t\right) = \frac{1}{2}\beta_q^2$$

$$\langle I''(t)Q''(t)\rangle = \beta_i*\cos(\omega t+\varphi_i)*\beta_q*\sin(\omega t+\varphi_q)$$

$$=\beta_i\beta_q\left(\frac{1}{2}\sin2\omega t+\varphi_q+\varphi_i\right)+\frac{1}{2}\sin(\varphi_q-\varphi_i)$$

$$=\beta_i\beta_q/2*\sin(\varphi_q-\varphi_i)$$

then:

$$\sin(\varphi_q-\varphi_i) = \frac{2*\langle I''(t)Q''(t)\rangle}{\beta_i\beta_q}$$

-continued $$\cos(\varphi_q-\varphi_i) = \sqrt{1-\sin^2(\varphi_q-\varphi_i)} = \sqrt{\frac{(\beta_i\beta_q)^2 - 4*\langle I''(t)Q''(t)\rangle^2}{(\beta_i\beta_q)^2}}$$

$$\sec(\varphi_q-\varphi_i) = \frac{\beta_i\beta_q}{\sqrt{(\beta_i\beta_q)^2 - 4*\langle I''(t)Q''(t)\rangle^2}}$$

$$= \frac{\sqrt{\langle I''(t)I''(t)\rangle\langle Q''(t)Q''(t)\rangle}}{\sqrt{\langle I''(t)I''(t)\rangle\langle Q''(t)Q''(t)\rangle - \langle I''(t)Q''(t)\rangle^2}}$$

$$\tan(\varphi_q-\varphi_i) = \frac{\sin(\varphi_q-\varphi_i)}{\cos(\varphi_q-\varphi_i)}$$

$$= \frac{2*\langle I''(t)Q''(t)\rangle^2}{\sqrt{(\beta_i\beta_q)^2 - 4*\langle I''(t)Q''(t)\rangle^2}}$$

$$= \frac{2}{\sqrt{\left(\frac{(\beta_i\beta_q)}{\langle I''(t)Q''(t)\rangle}\right)^2 - 4}}$$

$$= \frac{2}{\sqrt{\frac{4*\langle I''(t)I''(t)\rangle\langle Q''(t)Q''(t)\rangle}{\langle I''(t)Q''(t)\rangle^2} - 4}}$$

$$= \frac{1}{\sqrt{\frac{\langle I''(t)I''(t)\rangle\langle Q''(t)Q''(t)\rangle}{\langle I''(t)Q''(t)\rangle^2} - 1}}$$

$$= \frac{\langle I''(t)Q''(t)\rangle}{\sqrt{(\beta_i\beta_q)^2 - 4*\langle I''(t)Q''(t)\rangle^2}}$$

By further substituting $\tan(\varphi_q-\varphi_i)$, then:

$$\tan(\varphi_q-\varphi_i) = \frac{2*\langle I''(t)Q''(t)\rangle^2}{\sqrt{(\beta_i\beta_q)^2 - 4*\langle I''(t)Q''(t)\rangle^2}}$$

$$= \frac{\langle I''(t)Q''(t)\rangle}{\sqrt{\langle I''(t)I''(t)\rangle\langle Q''(t)Q''(t)\rangle - \langle I''(t)Q''(t)\rangle^2}}$$

From the formula 1, then:

$$dc_i = \langle I' \rangle, dc_q = \langle Q' \rangle$$
$$I'' = I' - dc_i, Q'' = Q' - dc_q$$
$$\beta_i = \sqrt{2\langle I''(t)I''(t)\rangle}$$
$$\beta_q = \sqrt{2\langle Q''(t)Q''(t)\rangle}$$
$$\sin(\varphi_q - \varphi_i) = \frac{2*\langle I''(t)Q''(t)\rangle}{\beta_i \beta_q}$$
$$\cos(\varphi_q - \varphi_i) = \sqrt{1 - \sin^2(\varphi_q - \varphi_i)}$$

$$\sin\varphi_q =$$
$$\sin(\varphi_q - \varphi_i + \varphi_i) = \sin(\varphi_q - \varphi_i)\cos(\varphi_i) + \cos(\varphi_q - \varphi_i)\sin(\varphi_i)$$
$$\cos\varphi_q = \cos(\varphi_q - \varphi_i + \varphi_i)$$
$$= \cos(\varphi_q - \varphi_i)\cos(\varphi_i) - \sin(\varphi_q - \varphi_i)\sin(\varphi_i)$$

$$\begin{bmatrix} \beta_i\cos\varphi_i & -\beta_i\sin\varphi_i \\ \beta_q\sin\varphi_q & \beta_q\cos\varphi_q \end{bmatrix} = \begin{bmatrix} \beta_i & 0 \\ 0 & \beta_q \end{bmatrix}\begin{bmatrix} \cos\varphi_i & -\sin\varphi_i \\ \sin\varphi_q & \cos\varphi_q \end{bmatrix} =$$

$$\begin{bmatrix} \beta_i & 0 \\ 0 & \beta_q \end{bmatrix}\begin{bmatrix} \cos\varphi_i & -\sin\varphi_i \\ \sin(\varphi_q-\varphi_i)\cos(\varphi_i) + \cos(\varphi_q-\varphi_i)\cos(\varphi_i) - \\ \cos(\varphi_q-\varphi_i)\sin(\varphi_i) & \sin(\varphi_q-\varphi_i)\sin(\varphi_i) \end{bmatrix} =$$

$$\begin{bmatrix} \beta_i & 0 \\ 0 & \beta_q \end{bmatrix}\begin{bmatrix} 1 & 0 \\ \sin(\varphi_q-\varphi_i) & 1 \end{bmatrix}$$

$$\begin{bmatrix} \cos\varphi_i & -\sin\varphi_i \\ \cos(\varphi_q-\varphi_i)\sin(\varphi_i) & \cos(\varphi_q-\varphi_i)\cos(\varphi_i) \end{bmatrix} =$$

$$\begin{bmatrix} \beta_i & 0 \\ 0 & \beta_q \end{bmatrix}\begin{bmatrix} 1 & 0 \\ \sin(\varphi_q-\varphi_i) & 1 \end{bmatrix}\begin{bmatrix} 1 & 0 \\ 0 & \cos(\varphi_q-\varphi_i) \end{bmatrix}$$

$$\begin{bmatrix} \cos\varphi_i & -\sin\varphi_i \\ \sin(\varphi_i) & \cos(\varphi_i) \end{bmatrix} = \begin{bmatrix} \beta_i & 0 \\ 0 & \beta_q \end{bmatrix}$$

$$\begin{bmatrix} 1 & 0 \\ \sin(\varphi_q-\varphi_i) & 1 \end{bmatrix}\begin{bmatrix} 1 & 0 \\ 0 & \cos(\varphi_q-\varphi_i) \end{bmatrix}$$

$$\begin{bmatrix} I''(t) \\ Q''(t) \end{bmatrix} = \begin{bmatrix} \beta_i\cos\varphi_i & -\beta_i\sin\varphi_i \\ \beta_q\sin\varphi_q & \beta_q\cos\varphi_q \end{bmatrix}\begin{bmatrix} I(t) \\ Q(t) \end{bmatrix} = \begin{bmatrix} \beta_i & 0 \\ 0 & \beta_q \end{bmatrix}\begin{bmatrix} 1 & 0 \\ \sin(\varphi_q-\varphi_i) & 1 \end{bmatrix}$$

$$\begin{bmatrix} 1 & 0 \\ 0 & \cos(\varphi_q-\varphi_i) \end{bmatrix}\begin{bmatrix} \cos\varphi_i & -\sin\varphi_i \\ \sin(\varphi_i) & \cos(\varphi_i) \end{bmatrix}\begin{bmatrix} I(t) \\ Q(t) \end{bmatrix}$$

$$\because \begin{bmatrix} 1 & 0 \\ \sin(\varphi_q-\varphi_i) & 1 \end{bmatrix}\begin{bmatrix} 1 & 0 \\ 0 & \cos(\varphi_q-\varphi_i) \end{bmatrix} = \begin{bmatrix} 1 & 0 \\ \sin(\varphi_q-\varphi_i) & \cos(\varphi_q-\varphi_i) \end{bmatrix}$$

$$\therefore \begin{bmatrix} I''(t) \\ Q''(t) \end{bmatrix} = \begin{bmatrix} \beta_i & 0 \\ 0 & \beta_q \end{bmatrix}\begin{bmatrix} 1 & 0 \\ \sin(\varphi_q-\varphi_i) & \cos(\varphi_q-\varphi_i) \end{bmatrix}$$

$$\begin{bmatrix} \cos\varphi_i & -\sin\varphi_i \\ \sin(\varphi_i) & \cos(\varphi_i) \end{bmatrix}\begin{bmatrix} I(t) \\ Q(t) \end{bmatrix}$$

$$\begin{bmatrix} \cos\varphi_i & -\sin\varphi_i \\ \sin(\varphi_i) & \cos(\varphi_i) \end{bmatrix}\begin{bmatrix} I(t) \\ Q(t) \end{bmatrix} = \left(\begin{bmatrix} \beta_i & 0 \\ 0 & \beta_q \end{bmatrix}\begin{bmatrix} 1 & 0 \\ \sin(\varphi_q-\varphi_i) & \cos(\varphi_q-\varphi_i) \end{bmatrix}\right)^{-1}$$

$$\begin{bmatrix} I''(t) \\ Q''(t) \end{bmatrix} = \begin{bmatrix} \beta_i & 0 \\ \beta_q\sin(\varphi_q-\varphi_i) & \beta_q\cos(\varphi_q-\varphi_i) \end{bmatrix}^{-1}$$

$$\begin{bmatrix} I''(t) \\ Q''(t) \end{bmatrix} = \begin{bmatrix} 1/\beta_i & 0 \\ \frac{1}{\beta_i}*\tan(\varphi_q-\varphi_i) & \frac{1}{\beta_q}*\sec(\varphi_q-\varphi_i) \end{bmatrix}\begin{bmatrix} I''(t) \\ Q''(t) \end{bmatrix}$$

Thus, the calculation formula for compensating the imbalance of the amplitude and the phase between the I path and the Q path can be obtained:

$$\begin{bmatrix} \cos\varphi_i & -\sin\varphi_i \\ \sin(\varphi_i) & \cos(\varphi_i) \end{bmatrix}\begin{bmatrix} I(t) \\ Q(t) \end{bmatrix} = \begin{bmatrix} 1/\beta_i & 0 \\ \frac{1}{\beta_i}*\tan(\varphi_q-\varphi_i) & \frac{1}{\beta_q}*\sec(\varphi_q-\varphi_i) \end{bmatrix}\begin{bmatrix} I''(t) \\ Q''(t) \end{bmatrix}$$

If $\beta_i$ is greater than $\beta_q$, then $$\begin{bmatrix} \cos\varphi_i & -\sin\varphi_i \\ \sin(\varphi_i) & \cos(\varphi_i) \end{bmatrix}\begin{bmatrix} \beta_q I(t) \\ \beta_q Q(t) \end{bmatrix} = \quad \text{(formula 2)}$$

$$\begin{bmatrix} \beta_q/\beta_i & 0 \\ \frac{\beta_q}{\beta_i}*\tan(\varphi_q-\varphi_i) & \sec(\varphi_q-\varphi_i) \end{bmatrix}\begin{bmatrix} I''(t) \\ Q''(t) \end{bmatrix}$$

If $\beta_q$ is greater than $\beta_i$, then $$\begin{bmatrix} \cos\varphi_i & -\sin\varphi_i \\ \sin(\varphi_i) & \cos(\varphi_i) \end{bmatrix}\begin{bmatrix} \beta_i I(t) \\ \beta_i Q(t) \end{bmatrix} = \quad \text{(formula 3)}$$

$$\begin{bmatrix} 1 & 0 \\ \tan(\varphi_q-\varphi_i) & \frac{\beta_i}{\beta_q}*\sec(\varphi_q-\varphi_i) \end{bmatrix}\begin{bmatrix} I''(t) \\ Q''(t) \end{bmatrix}$$

It should be noted that Formula 2 and Formula 3 are the preset formulas in operation 104. Using these two formulas and the results calculated above, the data received from the I path and the data received from the Q path can be calibrated correctly.

Figure 2:
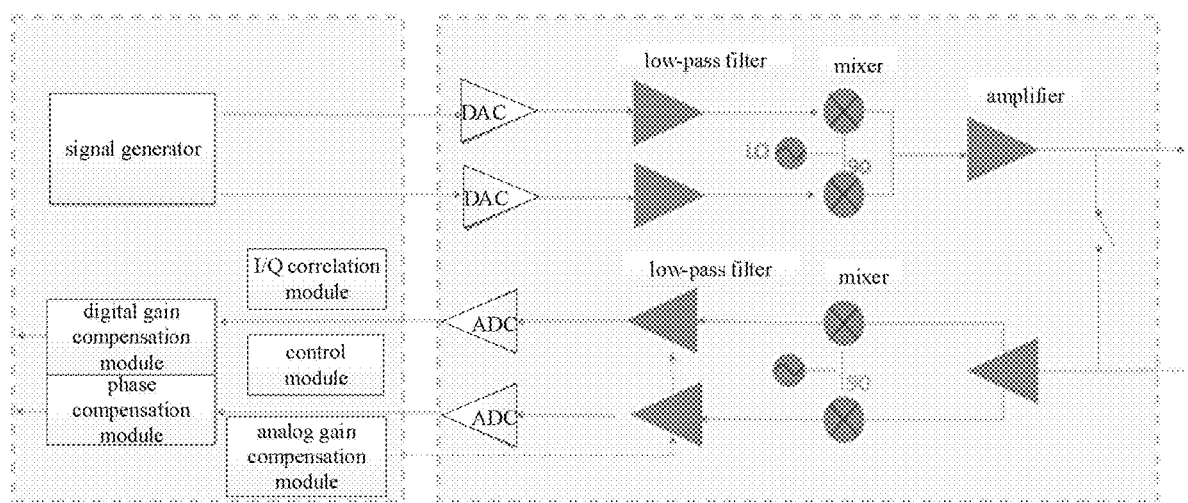
FIG. 2 shows a schematic architectural diagram of a system for compensating an imbalance between an I path and a Q path of a receiver according to an embodiment of the present disclosure.

In order to better understand the implementation process of this embodiment, as shown in FIG. 2, the corresponding compensation system architecture of the unbalanced between I path and Q path of the receiver is given, which is divided into left and right parts. The left includes several main modules, such as a signal generator based on the cordic principle, an I/Q correlation module, an analog gain compensation module, a digital gain compensation module, a phase compensation module, a control module, etc. The right is the radio frequency link part. It is necessary to return the transmitted signal through the switch loop to the signal receiving direction after the up conversion, in conjunction with IQ imbalance calibration. The RF link part includes a digital-to-analog converter (DAC), an analog-to-digital converter (ADC), an amplifier, a low-pass filter, a local oscillator (LO) and a mixer.

Through the coordinated operation between the above modules, accurate and effective compensation and adjustment of the imbalance between the I path and Q path of the receiver can be achieved, including:

(1) the control module is configured to send a cosine wave in the I path and a sine wave in the Q path through a signal generator based on the cordic principle. The cosine wave and the sine wave are orthogonal to each other (the following uses this case as an example). It can also be configured to send a sine wave in the I path and a cosine wave in the Q path. The amplitude and phase increase compensation can be changed through the cordic principle to change the amplitude and frequency of the sine and cosine waveforms. When the waveform is generated by the waveform generator, the sine and cosine wave values generated in advance can be stored;

(2) the correlation module is configured to calculate autocorrelation values $\langle I''(t)I''(t)\rangle$, $\langle Q''(t)Q''(t)\rangle$ and $\langle I''(t)Q''(t)\rangle$ of the I path and the Q path in the signal receiving direction;

(3) determining $\beta_i$ being greater than $\beta_q$, or $\beta_i$ being less than $\beta_q$ according to the formula $$\langle I''(t)I''(t)\rangle = \beta_i^2 \langle \cos^2(\omega t + \varphi_i)\rangle = \beta_i^2 \left(\frac{1}{2} + \frac{1}{2}\cos 2\omega t\right) = \frac{1}{2}\beta_i^2 \text{ and}$$

$$\langle Q''(t)Q''(t)\rangle = \beta_q^2 \langle \cos^2(\omega t + \varphi_q)\rangle = \beta_q^2 \left(\frac{1}{2} + \frac{1}{2}\cos 2\omega t\right) = \frac{1}{2}\beta_q^2;$$

(4) calculating $\beta_i/\beta_q$ (when $\beta_i$ is less than or equal to $\beta_q$) using the divider and rooting device, or $\beta_q/\beta_i$ (when $\beta_i$ is larger than or equal to $\beta_q$);

(5) calculating the adjustment compensation value of the analog domain gain amplifier in the I path or Q path according to the calculated value of $\beta_i/\beta_q$ or $\beta_q/\beta_i$, and the minimum adjustment compensation of the analog domain amplifier to minimize the value between $\beta_i$ and $\beta_q$, and compensate the remaining residue in the digital domain;

(6) calculating $\sec(\varphi_q-\varphi_i)$ using the divider and rooting device according to the formula:

$$\sec(\varphi_q - \varphi_i) = \frac{\beta_i\beta_q}{\sqrt{(\beta_i\beta_q)^2 - 4*\langle I''(t)Q''(t)\rangle^2}} = \frac{\sqrt{\langle I''(t)I''(t)\rangle\langle Q''(t)Q''(t)\rangle}}{\sqrt{\langle I''(t)I''(t)\rangle\langle Q''(t)Q''(t)\rangle - \langle I''(t)Q''(t)\rangle^2}};$$

and (7) calculating $\tan(\varphi_q-\varphi_i)$ using the divider and rooting device according to the formula:

$$\tan(\varphi_q - \varphi_i) = \frac{2*\langle I''(t)Q''(t)\rangle}{\sqrt{(\beta_i\beta_q)^2 - 4*\langle I''(t)Q''(t)\rangle^2}} = \frac{\langle I''(t)Q''(t)\rangle}{\sqrt{\langle I''(t)I''(t)\rangle\langle Q''(t)Q''(t)\rangle - \langle I''(t)Q''(t)\rangle^2}};$$

(8) adjusting the analog amplifier according to the compensation between the I or Q paths calculated in (5), using the calculation results of (3), (4), (6) and (7), and compensating the amplitude and phase of the digital domain according to the above (Formula 2) or (Formula 3).

It should be noted that the above formulas are not the only formulas to implement the present disclosure, but are only used as an implementation manner of the embodiments. Technicians can make appropriate modifications to the formula according to business needs, and still fall within the scope of the present disclosure, such as adding parameters or multiple values.

By applying the above solution, compared with the current existing technology, the embodiments of the present disclosure can accurately calculate the adjustment compensation value of the analog domain gain amplifier, and the amplitude value and the phase value that need to be compensated in the digital domain. Furthermore, the compensation signal is compensated and adjusted according to these calculated values, and the unbalance between the I path and the Q path of the receiver can be compensated accurately and effectively.

Figure 3:
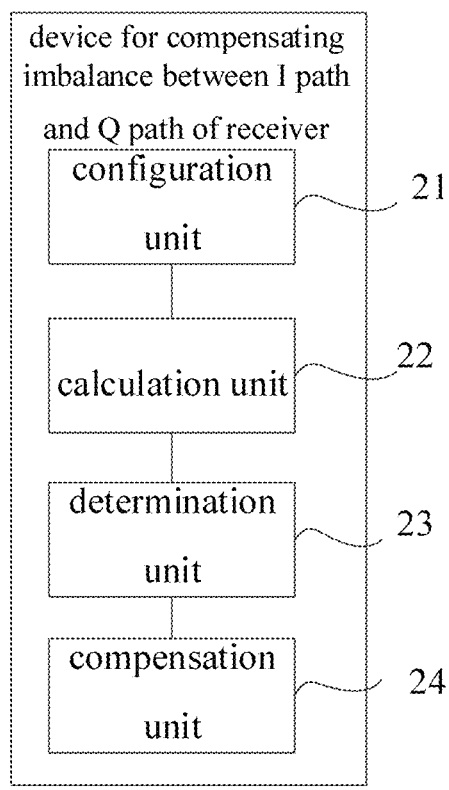
FIG. 3 shows a schematic structural diagram of a device for compensating an imbalance between an I path and a Q path of a receiver according to an embodiment of the present disclosure.

As a specific implementation of the method in FIG. 1, an embodiment of the present disclosure provides a device for compensating an imbalance between an I path and a Q path of a receiver. As shown in FIG. 3, the device includes: a configuration unit 21, a calculation unit 22, a determination unit 23, and a compensation unit 24.

the configuration unit 21, configured for sending a cosine signal and a sine signal through a signal generator with configurable waveform amplitude and phase when receiving a signal to be compensated, transmitting the cosine signal in the I path and transmitting the sine signal in the Q path, each path corresponding to a signal, the cosine signal and the sine signal being configured to loop back to a signal receiving direction after passing through an up conversion;

the calculation unit 22, configured for calculating autocorrelation values of the I path and the Q path in the signal receiving direction;

the determination unit 23, configured for determining a comparison result of amplitudes of the cosine signal received by the I path and the sine signal received by the Q path according to the autocorrelation values;

the calculation unit 22, further configured for calculating an adjustment compensation value of an analog domain gain amplifier, and an amplitude value and a phase value to be compensated in a digital domain according to the comparison result of amplitudes; and the compensation unit 24, configured for compensating and adjusting the signal to be compensated according to the adjustment compensation value, the amplitude value and the phase value.

In specific application scenarios, the calculation unit 22 may be further configured for calculating an autocorrelation value $\langle I''(t)I''(t)\rangle$ of the I path, an autocorrelation value $\langle Q''(t)Q''(t)\rangle$ of the Q path, and an autocorrelation value $\langle I''(t)Q''(t)\rangle$ between the I path and Q path during an integer multiple period in the signal receiving direction;

Correspondingly, the determination unit 23 may be further configured for determining the amplitude $\beta_i$ of the cosine signal received by the I path being greater than the amplitude $\beta_q$ of the sine signal received by the Q path, or $\beta_i$ being less than $\beta_q$ according to a first preset formula $$\langle I''(t)I''(t)\rangle = \beta_i^2 \langle \cos^2(\omega t + \varphi_i)\rangle = \beta_i^2 \left(\frac{1}{2} + \frac{1}{2}\cos 2\omega t\right) = \frac{1}{2}\beta_i^2 \text{ and}$$

$$\langle Q''(t)Q''(t)\rangle = \beta_q^2 \langle \cos^2(\omega t + \varphi_q)\rangle = \beta_i^2 \left(\frac{1}{2} + \frac{1}{2}\cos 2\omega t\right) = \frac{1}{2}\beta_q^2$$

when the I path is configured to receive the cosine signal and the Q path is configured to receive the sine signal, $\varphi_i$ represents a phase of the cosine signal received by the I path and $\varphi_q$ represents a phase of the sine signal received by the Q path.

In specific application scenarios, the calculation unit 22 may be further configured to calculate a value of $\beta_i/\beta_q$ if $\beta_i$ is less than $\beta_q$, calculate a value of $\beta_q/\beta_i$ if $\beta_i$ is greater than $\beta_q$, and calculate a compensation value of the analog domain gain amplifier to be adjusted in the I path or Q path according to the calculated value of $\beta_i/\beta_q$ or $\beta_q/\beta_i$, and the minimum adjustment compensation of the analog domain amplifier to minimize the value between $\beta_i$ and $\beta_q$.

In specific application scenarios, the calculation unit 22 may be further configured to calculate $\sec(\varphi_q-\varphi_i)$ to a second preset formula $$\sec(\varphi_q - \varphi_i) = \frac{\beta_i\beta_q}{\sqrt{(\beta_i\beta_q)^2 - 4*\langle I''(t)Q''(t)\rangle^2}} =$$

-continued $$\frac{\sqrt{\langle I''(t)I''(t)\rangle\langle Q''(t)Q''(t)\rangle}}{\sqrt{\langle I''(t)I''(t)\rangle\langle Q''(t)Q''(t)\rangle - \langle I''(t)Q''(t)\rangle^2}};$$

and calculate $\tan(\varphi_q - \varphi_i)$ according to a third preset formula $$\tan(\varphi_q - \varphi_i) = \frac{2*\langle I''(t)Q''(t)\rangle}{\sqrt{(\beta_i\beta_q)^2 - 4*\langle I''(t)Q''(t)\rangle^2}} =$$

$$\frac{\langle I''(t)Q''(t)\rangle}{\sqrt{\langle I''(t)I''(t)\rangle\langle Q''(t)Q''(t)\rangle - \langle I''(t)Q''(t)\rangle^2}};$$

based on the above result, if $\beta_i$ is greater than $\beta_q$, compensating the received I(t) and Q(t) for amplitude and phase of according to a fourth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} \beta_q/\beta_i & 0 \\ \frac{\beta_q}{\beta_i}*\tan(\varphi_q - \varphi_i) & \sec(\varphi_q - \varphi_i) \end{bmatrix} \begin{bmatrix} I''(t) \\ Q''(t) \end{bmatrix}.$$

if $\beta_i$ is less than $\beta_q$, compensating the received I(t) and Q(t) for amplitude and phase according to a fifth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} 1 & 0 \\ \tan(\varphi_q - \varphi_i) & \frac{\beta_q}{\beta_i}*\sec(\varphi_q - \varphi_i) \end{bmatrix} \begin{bmatrix} I''(t) \\ Q''(t) \end{bmatrix}.$$

Using these two formulas and the results calculated above, the data received by the I path and the data received by the Q path can be calibrated correctly.

In specific application scenarios, the compensation unit 24 may be further configured to compensate and adjust the analog domain gain amplifier according to the adjustment compensation value, and after compensating and adjusting the analog domain gain amplifier, compensate and adjust the digital domain according to the amplitude value and the phase value.

In specific application scenarios, the signal generator may generate a sine wave and a cosine wave based on a cordic principle, or store data points of the sine wave and the cosine wave to a random access memory (RAM), for sending waveforms of the sine wave and the cosine wave from the RAM using a waveform generator.

It should be noted that other corresponding descriptions of each functional unit of the device for compensating the imbalance between the I path and the Q path of the receiver of the embodiments of the present disclosure may refer to the corresponding description in FIG. 1, and details are not described herein again.

Based on the method shown in FIG. 1, correspondingly, the embodiments of the present disclosure further provides a storage medium on which a computer program is stored, the program, when executed by a processor, implements the operations of the method for compensating the imbalance between the I path and the Q path of the receiver described in FIG. 1.

Based on the above embodiments shown in FIGS. 1 to 2, in order to achieve the above objective, the embodiments of the present disclosure further provides a physical device for compensating the imbalance between the I path and the Q path of the receiver. The physical device includes a storage medium, a processor and a computer program stored on the storage medium and executable on the processor, the program, when executed by the processor, implements the operations of the method for compensating the imbalance between the I path and the Q path of the receiver described in FIGS. 1 and 2.

By applying the above solution, compared with the current existing technology, the embodiments of the present disclosure can accurately calculate the adjustment compensation value of the analog domain gain amplifier, and the amplitude value and the phase value that need to be compensated in the digital domain. Furthermore, the compensation signal is compensated and adjusted according to these calculated values, and the unbalance between the I path and the Q path of the receiver can be compensated accurately and effectively.

Through the description of the above embodiments, those skilled in the art may clearly understand that the present disclosure can be implemented by hardware, or by software plus a necessary general hardware platform. Based on this understanding, the technical solutions of the present disclosure may be embodied in the form of software products. The software product can be stored in a non-volatile storage medium (such as a CD-ROM, a U disk, a mobile hard disk, etc.), including several instructions to enable a computer device (such as a personal computer, a server, or a network device, etc.) to execute the method of each implementation scenario of the present disclosure.

Those skilled in the art may understand that the drawings are only schematic diagrams of an optional implementation scenario, and the modules or processes in the drawings are not necessarily required to implement the present disclosure.

Those skilled in the art may understand that the modules in the device in the implementation scenario may be distributed in the device in the implementation scenario according to the description of the implementation scenario, or may be changed accordingly in one or more devices different from the implementation scenario. The modules in the above implementation scenarios can be combined into one module or split into multiple sub-modules.

The above serial number of the present disclosure is for description only, and does not represent the advantages and disadvantages of the implementation scenario.

The above disclosure are only a few specific implementation scenarios of the present disclosure, however, the present disclosure is not limited to this, and any changes that can be thought by those skilled in the art should fall within the scope of the present disclosure.

What is claimed is:

1. A method for compensating an imbalance between an I path and a Q path of a receiver, comprising:
    sending a cosine signal and a sine signal through a signal generator with configurable waveform amplitude and phase when receiving a signal to be compensated, transmitting the cosine signal and the sine signal in the I path and Q path respectively, each path corresponding to a signal, the cosine signal and the sine signal being configured to loop back to a signal receiving direction after passing through an up conversion;
    calculating autocorrelation values of the I path and the Q path in the signal receiving direction;
    determining a comparison result of amplitudes of the cosine signal received by the I path and the sine signal received by the Q path according to the autocorrelation values;

calculating an adjustment compensation value of an analog domain gain amplifier, and an amplitude value and a phase value to be compensated in a digital domain according to the comparison result of amplitudes; and compensating and adjusting the signal to be compensated according to the adjustment compensation value, the amplitude value and the phase value.

2. The method of claim 1, wherein the operation of "calculating autocorrelation values of the I path and the Q path in the signal receiving direction" comprises:

calculating an autocorrelation value $<I''(t)I''(t)>$ of the I path, an autocorrelation value $<Q''(t)Q''(t)>$ of the Q path, and an autocorrelation value $<I''(t)Q''(t)>$ between the I path and Q path during integer multiple periods in the signal receiving direction;

in response to a determination that the I path is configured to receive the cosine signal and the Q path is configured to receive the sine signal, the operation of "determining a comparison result of amplitudes of the cosine signal received by the I path and the sine signal received by the Q path according to the autocorrelation values" comprises:

determining the amplitude $\beta_i$ of the cosine signal received by the I path being greater than the amplitude $\beta_q$ of the sine signal received by the Q path, or $\beta_i$ being less than or equal to $\beta_q$ according to a first preset formula $$<I''(t)I''(t)>=\beta_i^2<\cos^2(\omega t+\varphi i)>\beta i^2<\tfrac{1}{2}+\tfrac{1}{2}\cos 2\omega t>=\tfrac{1}{2}\beta i^2$$

and $$<Q''(t)Q''(t)>=\beta_q^2<\cos^2(\omega t+\varphi_q)>=\beta_q^2<\tfrac{1}{2}+\tfrac{1}{2}\cos 2\omega t>=\tfrac{1}{2}\beta_q^2$$

, $\varphi_i$ represents a phase of the cosine signal received by the I path and $\varphi_q$ represents a phase of the sine signal received by the Q path.

3. The method of claim 2, wherein the operation of "calculating an adjustment compensation value of an analog domain gain amplifier according to the comparison result of amplitudes" comprises:

calculating a value of $\beta_i/\beta_q$ if $\beta_i$ is less than or equal to $\beta_q$;
calculating a value of $\beta_q/\beta_i$ if $\beta_i$ is greater than $\beta_q$; and
calculating the adjustment compensation value of the analog domain gain amplifier in the I path or Q path according to the calculated value of $\beta_i/\beta_q$ or $\beta_q/\beta_i$ and a minimum adjustment compensation of the analog domain amplifier to minimize a difference value between $\beta_i$ and $\beta_q$.

4. The method of claim 3, wherein the operation of "calculating an amplitude value and a phase value to be compensated in a digital domain according to the comparison result of amplitudes" comprises:

calculating $\sec(\varphi_q-\varphi_i)$ according to a second preset formula $$\sec(\varphi_q - \varphi_i) = \frac{\beta_i\beta_q}{\sqrt{(\beta_i\beta_q)^2 - 4*\langle I''(t)Q''(t)\rangle}} = \frac{\sqrt{\langle I''(t)I''(t)\rangle\langle Q''(t)Q''(t)\rangle}}{\sqrt{\langle I''(t)I''(t)\rangle\langle Q''(t)Q''(t)\rangle - \langle I''(t)Q''(t)\rangle^2}};$$

and calculating $\tan(\varphi_q-\varphi_i)$ according to a third preset formula $$\tan(\varphi_q - \varphi_i) = \frac{2*\langle I''(t)Q''(t)\rangle}{\sqrt{(\beta_i\beta_q)^2 - 4*\langle I''(t)Q''(t)\rangle^2}} = \frac{\langle I''(t)Q''(t)\rangle}{\sqrt{\langle I''(t)I''(t)\rangle\langle Q''(t)Q''(t)\rangle - \langle I''(t)Q''(t)\rangle^2}};$$

based on the above result, if $\beta_i$ is greater than $\beta_q$, compensating the received I(t) and Q(t) for amplitude and phase according to a fourth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} \beta_q/\beta_i & 0 \\ \frac{\beta_q}{\beta_i}*\tan(\varphi_q-\varphi_i) & \sec(\varphi_q-\varphi_i) \end{bmatrix} \begin{bmatrix} I''(t) \\ Q''(t) \end{bmatrix};$$

if $\beta_i$ is less than or equal to $\beta_q$, compensating the received I(t) and Q(t) for amplitude and phase according to a fifth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} 1 & 0 \\ \tan(\varphi_q-\varphi_i) & \frac{\beta_q}{\beta_i}*\sec(\varphi_q-\varphi_i) \end{bmatrix} \begin{bmatrix} I''(t) \\ Q''(t) \end{bmatrix}.$$

5. The method of claim 4, wherein the operation of "compensating and adjusting the signal to be compensated according to the adjustment compensation value, the amplitude value and the phase value" comprises:

compensating and adjusting the analog domain gain amplifier according to the adjustment compensation value, and after compensating and adjusting the analog domain gain amplifier, compensating and adjusting the digital domain according to the amplitude value and the phase value.

6. A non-transitory computer readable storage medium storing a computer program, wherein the program, when executed by a processor, implements the following operations:

sending a cosine signal and a sine signal through a signal generator with configurable waveform amplitude and phase when receiving a signal to be compensated, transmitting the cosine signal and the sine signal in the I path and Q path respectively, each path corresponding to a signal, the cosine signal and the sine signal being configured to loop back to a signal receiving direction after passing through an up conversion;

calculating autocorrelation values of the I path and the Q path in the signal receiving direction;

determining a comparison result of amplitudes of the cosine signal received by the I path and the sine signal received by the Q path according to the autocorrelation values;

calculating an adjustment compensation value of an analog domain gain amplifier, and an amplitude value and a phase value to be compensated in a digital domain according to the comparison result of amplitudes; and compensating and adjusting the signal to be compensated according to the adjustment compensation value, the amplitude value and the phase value.

7. The non-transitory computer readable storage medium of claim 6, wherein the operation of "calculating autocorrelation values of the I path and the Q path in the signal receiving direction" comprises:
  calculating an autocorrelation value <I"(t)I"(t)> of the I path, an autocorrelation value <Q"(t)Q"(t)> of the Q path, and an autocorrelation value <I"(t)Q"(t)> between the I path and Q path during integer multiple periods in the signal receiving direction;
  in response to a determination that the I path is configured to receive the cosine signal and the Q path is configured to receive the sine signal, the operation of "determining a comparison result of amplitudes of the cosine signal received by the I path and the sine signal received by the Q path according to the autocorrelation values" comprises:
  determining the amplitude $\beta_i$ of the cosine signal received by the I path being greater than the amplitude $\beta_q$ of the sine signal received by the Q path, or $\beta_i$ being less than or equal to $\beta_q$ according to a first preset formula $$<I'(t)I'(t)> = \beta_i^2 <\cos^2(\omega t + \varphi i)> = \beta_i^2 <1/2 + 1/2 \cos 2\omega t> = 1/2 \beta_i^2$$

and $$<Q"(t)Q"(t)> = \beta_q^2 <\cos^2(\omega t + \varphi q)> = \beta_q^2 <1/2 + 1/2 \cos 2\omega t> = 1/2 \beta_q^2$$

$\varphi_i$ represents a phase of the cosine signal received by the I path and $\varphi_q$ represents a phase of the sine signal received by the Q path.

8. The non-transitory computer readable storage medium of claim 7, wherein the operation of "calculating an adjustment compensation value of an analog domain gain amplifier according to the comparison result of amplitudes" comprises:
  calculating a value of $\beta_i/\beta_q$ if $\beta_i$ is less than or equal to $\beta_q$;
  calculating a value of $\beta_q/\beta_i$ if $\beta_i$ is greater than $\beta_q$; and
  calculating the compensation value of the analog domain gain amplifier in the I path or Q path according to the calculated value of $\beta_i/\beta_q$ or $\beta_q/\beta_i$ and a minimum adjustment compensation of the analog domain amplifier to minimize a difference value between $\beta_i$ and $\beta_q$.

9. The non-transitory computer readable storage medium of claim 8, wherein the operation of "calculating an amplitude value and a phase value to be compensated in a digital domain according to the comparison result of amplitudes" comprises:
  calculating sec $(\varphi_q - \varphi_i)$ according to a second preset formula $$\sec(\varphi_q - \varphi_i) = \frac{\beta_i \beta_q}{\sqrt{(\beta_i \beta_q)^2 - 4*\langle I"(t)Q"(t)\rangle^2}} = \frac{\sqrt{\langle I"(t)I"(t)\rangle \langle Q"(t)Q"(t)\rangle}}{\sqrt{\langle I"(t)I"(t)\rangle \langle Q"(t)Q"(t)\rangle - \langle I"(t)Q"(t)\rangle^2}};$$

and
calculating tan $(\varphi_q - \varphi_i)$ according to a third preset formula $$\tan(\varphi_q - \varphi_i) = \frac{2*\langle I"(t)Q"(t)\rangle}{\sqrt{(\beta_i \beta_q)^2 - 4*\langle I"(t)Q"(t)\rangle^2}} =$$

-continued
$$\frac{\langle I"(t)Q"(t)\rangle}{\sqrt{\langle I"(t)I"(t)\rangle \langle Q"(t)Q"(t)\rangle - \langle I"(t)Q"(t)\rangle^2}};$$

based on the above result, if $\beta_i$ is greater than $\beta_q$, compensating the received I(t) and Q(t) for amplitude and phase according to a fourth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} \beta_q/\beta_i & 0 \\ \frac{\beta_q}{\beta_i}*\tan(\varphi_q - \varphi_i) & \sec(\varphi_q - \varphi_i) \end{bmatrix} \begin{bmatrix} I"(t) \\ Q"(t) \end{bmatrix};$$

if $\beta_i$ is less than or equal to $\beta_q$, compensating the received I(t) and Q(t) for amplitude and phase according to a fifth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} 1 & 0 \\ \tan(\varphi_q - \varphi_i) & \frac{\beta_q}{\beta_i}*\sec(\varphi_q - \varphi_i) \end{bmatrix} \begin{bmatrix} I"(t) \\ Q"(t) \end{bmatrix}.$$

10. The non-transitory computer readable storage medium of claim 9, wherein the operation of "compensating and adjusting the signal to be compensated according to the adjustment compensation value, the amplitude value and the phase value" comprises:
  compensating and adjusting the analog domain gain amplifier according to the adjustment compensation value, and after compensating and adjusting the analog domain gain amplifier, compensating and adjusting the digital domain according to the amplitude value and the phase value.

11. The non-transitory computer readable storage medium of claim 6, wherein the signal generator is configured to generate a sine wave and a cosine wave based on a cordic principle, or store data points of the sine wave and the cosine wave to a random access memory (RAM), for sending waveforms of the sine wave and the cosine wave from the RAM using a waveform generator.

12. A device for compensating an imbalance between an I path and a Q path of a receiver, comprising a storage medium, a processor and a computer program stored on the storage medium and executable on the processor, wherein the program, when executed by the processor, implements the following operations:
  sending a cosine signal and a sine signal through a signal generator with configurable waveform amplitude and phase when receiving a signal to be compensated, transmitting the cosine signal and the sine signal in the I path and the Q path respectively, each path corresponding to a signal, the cosine signal and the sine signal being configured to loop back to a signal receiving direction after passing through an up conversion;
  calculating autocorrelation values of the I path and the Q path in the signal receiving direction;
  determining a comparison result of amplitudes of the cosine signal received by the I path and the sine signal received by the Q path according to the autocorrelation values;
  calculating an adjustment compensation value of an analog domain gain amplifier, and an amplitude value and a phase value to be compensated in a digital domain according to the comparison result of amplitudes; and compensating and adjusting the signal to be compensated according to the adjustment compensation value, the amplitude value and the phase value.

13. The device of claim 12, wherein the operation of "calculating autocorrelation values of the I path and the Q path in the signal receiving direction" comprises:

calculating an autocorrelation value $<I''(t)I''(t)>$ of the I path, an autocorrelation value $<Q''(t)Q''(t)>$ of the Q path, and an autocorrelation value $<I''(t)Q''(t)>$ between the I path and Q path during integer multiple periods in the signal receiving direction;

in response to a determination that the I path is configured to receive the cosine signal and the Q path is configured to receive the sine signal, the operation of "determining a comparison result of amplitudes of the cosine signal received by the I path and the sine signal received by the Q path according to the autocorrelation values" comprises:

determining the amplitude $\beta_i$ of the cosine signal received by the I path being greater than the amplitude $\beta_q$ of the sine signal received by the Q path, or $\beta_i$ being less than or equal to $\beta_q$ according to a first preset formula $<I''(t)I''(t)>=\beta_i^2<\cos^2(\omega t+\varphi i)>\beta_i^2<\frac{1}{2}+\frac{1}{2}\cos 2\varphi t>=\frac{1}{2}\beta_i^2$ and $<Q''(t)Q''(t)>=\beta_q^2<\cos^2(\omega t+\varphi_q)>=\beta_q^2<\frac{1}{2}+\frac{1}{2}\cos 2\omega t>=\frac{1}{2}\beta_q^2$ $\varphi_i$ represents a phase of the cosine signal received by the I path and $\varphi_q$ represents a phase of the sine signal received by the Q path.

14. The device of claim 13, wherein the operation of "calculating an adjustment compensation value of an analog domain gain amplifier according to the comparison result of amplitudes" comprises:

calculating a value of $\beta_i/\beta_q$ if $\beta_i$ is less than or equal to $\beta_q$;
calculating a value of $\beta_q/\beta_i$ if $\beta_i$ is greater than $\beta_q$; and
calculating the adjustment compensation value of the analog domain gain amplifier in the I path or Q path according to the calculated value of $\beta_i/\beta_q$ or $\beta_q/\beta_i$ and a minimum adjustment compensation of the analog domain amplifier to minimize a difference value between $\beta_i$ and $\beta_q$.

15. The device of claim 14, wherein the operation of "calculating an amplitude value and a phase value to be compensated in a digital domain according to the comparison result of amplitudes" comprises:

calculating sec $(\varphi_q-\varphi_i)$ according to a second preset formula $$\sec(\varphi_q - \varphi_i) = \frac{\beta_i\beta_q}{\sqrt{(\beta_i\beta_q)^2 - 4*\langle I''(t)Q''(t)\rangle^2}} =$$

$$\frac{\sqrt{\langle I''(t)I''(t)\rangle\langle Q''(t)Q''(t)\rangle}}{\sqrt{\langle I''(t)I''(t)\rangle\langle Q''(t)Q''(t)\rangle - \langle I''(t)Q''(t)\rangle^2}};$$

and calculating tan $(\varphi_q-\varphi_i)$ according to a third preset formula $$\tan(\varphi_q - \varphi_i) = \frac{2*\langle I''(t)Q''(t)\rangle}{\sqrt{(\beta_i\beta_q)^2 - 4*\langle I''(t)Q''(t)\rangle^2}} =$$

$$\frac{\langle I''(t)Q''(t)\rangle}{\sqrt{\langle I''(t)I''(t)\rangle\langle Q''(t)Q''(t)\rangle - \langle I''(t)Q''(t)\rangle^2}};$$

based on the above result, if $\beta_i$ is greater than $\beta_q$ compensating the received I(t) and Q(t) for amplitude and phase according to a fourth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} \beta_q/\beta_i & 0 \\ \frac{\beta_q}{\beta_i}*\tan(\varphi_q-\varphi_i) & \sec(\varphi_q-\varphi_i) \end{bmatrix} \begin{bmatrix} I''(t) \\ Q''(t) \end{bmatrix};$$

if $\beta_i$ is less than or equal to $\beta_q$, compensating the received I(t) and Q(t) for amplitude and phase according to a fifth preset formula $$\begin{bmatrix} \cos\varphi_i & -\sin\varphi_i \\ \sin(\varphi_i) & \cos(\varphi_i) \end{bmatrix} \begin{bmatrix} \beta_q I(t) \\ \beta_q Q(t) \end{bmatrix} = \begin{bmatrix} 1 & 0 \\ \tan(\varphi_q-\varphi_i) & \frac{\beta_q}{\beta_i}*\sec(\varphi_q-\varphi_i) \end{bmatrix} \begin{bmatrix} I''(t) \\ Q''(t) \end{bmatrix}.$$

16. The device of claim 15, wherein the operation of "compensating and adjusting the signal to be compensated according to the adjustment compensation value, the amplitude value and the phase value" comprises:

compensating and adjusting the analog domain gain amplifier according to the adjustment compensation value, and after compensating and adjusting the analog domain gain amplifier, compensating and adjusting the digital domain according to the amplitude value and the phase value.

17. The device of claim 12, wherein the signal generator is configured to generate a sine wave and a cosine wave based on a cordic principle, or store data points of the sine wave and the cosine wave to a random access memory (RAM), for sending waveforms of the sine wave and the cosine wave from the RAM using a waveform generator.

* * * * *